US011917927B2

United States Patent
Zou et al.

(10) Patent No.: US 11,917,927 B2
(45) Date of Patent: Feb. 27, 2024

(54) QUBIT ASSEMBLY, QUBIT ASSEMBLY PREPARATION METHOD, CHIP, AND DEVICE

(71) Applicant: Tencent Technology (Shenzhen) Company Limited, Shenzhen (CN)

(72) Inventors: Chenji Zou, Shenzhen (CN); Yarui Zheng, Shenzhen (CN); Hui Wang, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 0 days.

(21) Appl. No.: 17/972,434

(22) Filed: Oct. 24, 2022

(65) Prior Publication Data

US 2023/0115860 A1   Apr. 13, 2023

Related U.S. Application Data

(63) Continuation of application No. PCT/CN2021/135752, filed on Dec. 6, 2021.

(30) Foreign Application Priority Data

Oct. 8, 2021   (CN) .......................... 202111172563.5

(51) Int. Cl.
*H10N 60/01*   (2023.01)
*H10N 60/81*   (2023.01)

(52) U.S. Cl.
CPC ........... *H10N 60/01* (2023.02); *H10N 60/815* (2023.02)

(58) Field of Classification Search
CPC ...... H10N 60/01; H10N 60/815; H10N 69/00; H01L 24/13; H01L 24/81
See application file for complete search history.

(56) References Cited

U.S. PATENT DOCUMENTS

| 5,381,001 | A | * | 1/1995 | Perryman | .............. | H10N 60/10 505/848 |
| 9,761,542 | B1 | | 9/2017 | Sylvestre et al. | | |

(Continued)

FOREIGN PATENT DOCUMENTS

| CN | 103018701 A | 4/2013 |
| CN | 111183434 A | 5/2020 |

(Continued)

OTHER PUBLICATIONS

Poelaert et al. ("Quasiparticle energy relaxation in superconducting tunnel junctions used as photon detectors," Nuclear Instruments and Methods in Physics Research, A 444, pp. 55-58, 2000) (Year: 2000).*

(Continued)

*Primary Examiner* — Yasser A Abdelaziez
(74) *Attorney, Agent, or Firm* — Morgan, Lewis & Bockius LLP

(57) ABSTRACT

A production line device prepares a superconducting circuit layer on a substrate. The device prepares an under bump metallization (UBM) layer on an upper surface of the superconducting circuit layer. A superconducting connection is formed between the UBM layer and the superconducting circuit layer. The production device prepares a welding spot on an upper surface of the UBM layer to obtain a qubit assembly configured for a flip-chip superconducting quantum chip. A superconducting electrical connection is formed between the welding spot and the UBM layer.

20 Claims, 11 Drawing Sheets

(56) References Cited

U.S. PATENT DOCUMENTS

| | | | |
|---|---|---|---|
| 2004/0256727 A1* | 12/2004 | Aoyagi | H01L 25/0657 |
| | | | 257/E21.597 |
| 2005/0123674 A1* | 6/2005 | Stasiak | B82Y 10/00 |
| | | | 505/410 |
| 2014/0246763 A1 | 9/2014 | Bunyk | |
| 2017/0373044 A1 | 12/2017 | Das et al. | |
| 2019/0131510 A1 | 5/2019 | Abraham et al. | |
| 2020/0119251 A1* | 4/2020 | Yohannes | H01L 24/06 |
| 2020/0335685 A1 | 10/2020 | Shao et al. | |
| 2020/0401921 A1 | 12/2020 | Chow et al. | |
| 2021/0175408 A1 | 6/2021 | Gardner et al. | |

FOREIGN PATENT DOCUMENTS

| | | |
|---|---|---|
| CN | 112585772 A | 3/2021 |
| CN | 112652540 A | 4/2021 |
| CN | 113011591 A | 6/2021 |
| JP | H 08204244 A | 8/1996 |

OTHER PUBLICATIONS

Tencent Technology, ISR, PCT/CN2021/135752, dated Jun. 29, 2022, 3 pgs.

Tencent Technology, Extended European Search Report and Supplementary Search Report, EP21937220.8, dated Oct. 13, 2023, 7 pgs.

\* cited by examiner

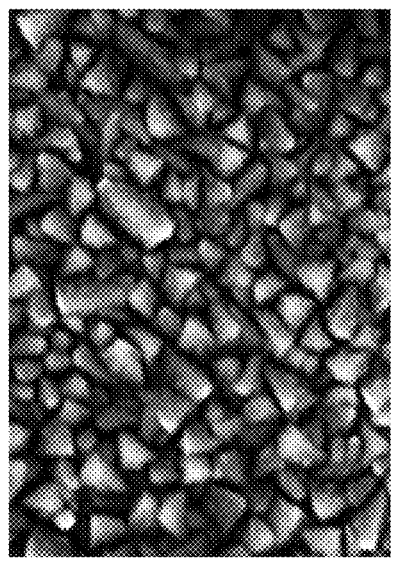
$10^{-2}$ torr
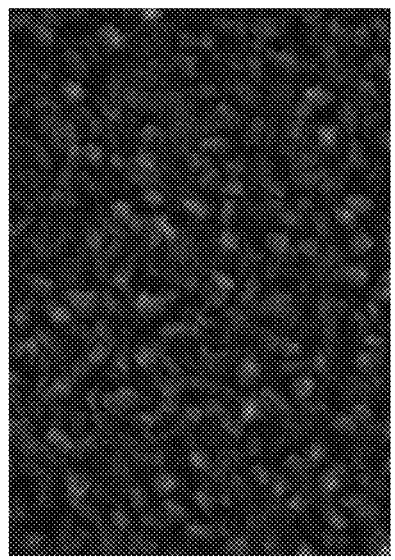
$5 \times 10^{-3}$ torr
FIG. 8
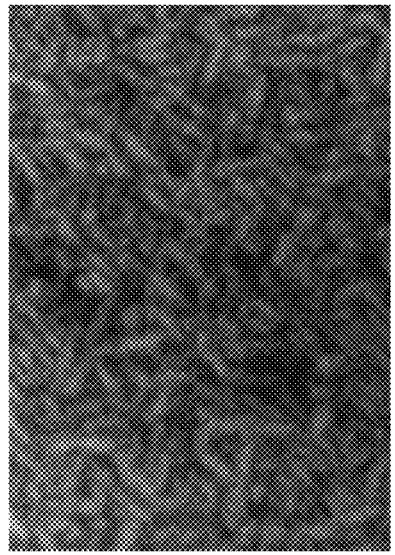
$10^{-3}$ torr 8 cm 10 cm

QUBIT ASSEMBLY, QUBIT ASSEMBLY PREPARATION METHOD, CHIP, AND DEVICE

CROSS-REFERENCE TO RELATED APPLICATIONS

This application is a continuation application of PCT Patent Application No. PCT/CN2021/135752, entitled "QUANTUM BIT COMPONENT, QUANTUM BIT COMPONENT PREPARATION METHOD, CHIP AND DEVICE" filed on Dec. 6, 2021, which claims priority to Chinese Patent Application No. 202111172563.5, filed with the State Intellectual Property Office of the People's Republic of China on Oct. 8, 2021, and entitled "QUBIT ASSEMBLY, QUBIT ASSEMBLY PREPARATION METHOD, CHIP, AND DEVICE", all of which are incorporated herein by reference in their entirety.

FIELD OF THE TECHNOLOGY

This application relates to the field of micro-nano processing technologies, and in particular, to a qubit assembly, a qubit assembly preparation method, a chip, and a device.

BACKGROUND OF THE DISCLOSURE

The flip-chip superconducting quantum chip packaging process is a process of welding two planar quantum chips through a superconducting material to obtain flip-chip superconducting quantum chips.

In the flip-chip superconducting quantum chip packaging process, an under bump metallization (UBM) layer is usually provided between a superconducting circuit layer and a solder bump to avoid formation between the welding spot and the superconducting circuit layer and destruction of the superconducting circuit structure between the two.

SUMMARY

Embodiments of this application provide a qubit assembly, a qubit assembly preparation method, a chip, and a device, which can improve performance of a flip-chip superconducting quantum chip. The technical solutions are as follows.

According to one aspect, a qubit assembly configured for a flip-chip superconducting quantum chip is provided. The qubit assembly includes a substrate, a superconducting circuit layer, a UBM layer, and a welding spot, the superconducting circuit layer is located on the substrate;

the UBM layer is located on the superconducting circuit layer, and a superconducting connection (e.g., electrical connection) is formed between the UBM layer and the superconducting circuit layer; a material of the UBM layer being a metal niobium; and the welding spot is located on the UBM layer, and a superconducting connection is formed between the welding spot and the UBM layer.

According to another aspect, a qubit assembly preparation method is provided, performed by a production line device (e.g., a production line system), the method including:

preparing a superconducting circuit layer on a substrate;

preparing a UBM layer on an upper surface of the superconducting circuit layer, a superconducting connection being formed between the UBM layer and the superconducting circuit layer; and a material of the UBM layer being a metal niobium; and preparing a welding spot on an upper surface of the UBM layer, to obtain a qubit assembly configured for a flip-chip superconducting quantum chip, a superconducting connection being formed between the welding spot and the UBM layer.

According to another aspect, a flip-chip superconducting quantum chip is provided, including two qubit assemblies according to the above, the two qubit assemblies being welded through a welding spot.

According to another aspect, a computer device is provided, including the flip-chip superconducting quantum chip according to the above.

According to yet another aspect, a production line device is provided, including: a mask aligner, an evaporator, and an etcher, the mask aligner, the evaporator, and the etcher being configured to cooperatively prepare the qubit assembly according to the above. In some embodiments, the production line device includes one or more processors and memory. The memory includes instructions that, when executed by the one or more processors, cause the one or more processors to perform any of the methods disclosed herein.

According to yet another aspect, a non-transitory computer-readable storage medium stores instructions that, when executed by one or more processors of a production line device, cause the one or more processors to perform any of the methods disclosed herein.

Beneficial effects brought by the technical solutions provided in the embodiments of this application are at least as follows.

In the qubit assembly configured for a flip-chip superconducting quantum chip, a UBM layer made of a metal niobium is arranged between a superconducting circuit layer and a welding spot. The metal niobium is a superconducting material, and the metal niobium is easier to peel off, and has less impact on the cleanliness of the superconducting circuit layer. Moreover, an oxide layer on the surface of the niobium is easier to remove than that on the surface of other superconducting materials, thereby forming a better superconducting contact with the welding spot. Therefore, by using the metal niobium as the UBM layer, superconducting performance between two planar superconducting quantum chips in the flip-chip superconducting quantum chip can be greatly improved, thereby improving performance of the flip-chip superconducting quantum chip.

It is to be understood that the foregoing general descriptions and the following detailed descriptions are merely exemplary and explanatory, and this application is not limited thereto.

BRIEF DESCRIPTION OF THE DRAWINGS

Accompanying drawings herein are incorporated into the specification and constitute a part of this specification, show embodiments that conform to this application, and are used for describing a principle of this application together with this specification.

FIG. 8 is an electron microscope image of a surface of a niobium film under different air pressures according to the embodiment shown in FIG. 4.

DESCRIPTION OF EMBODIMENTS

Figure 1:
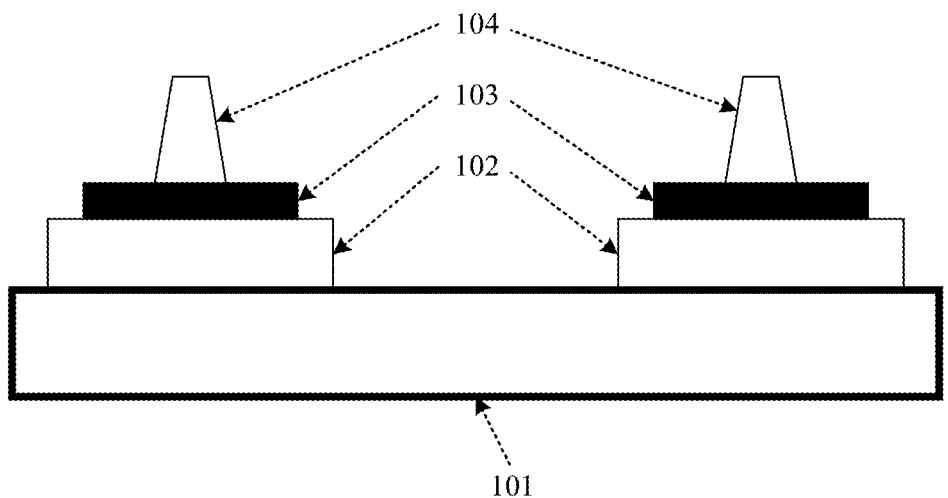
FIG. 1 is a schematic structural diagram of a qubit assembly according to this application.

Exemplary embodiments are described in detail herein, and examples thereof are shown in the accompanying drawings. When the following descriptions are made with reference to the accompanying drawings, unless indicated otherwise, same numbers in different accompanying drawings represent same or similar elements. The following implementations described in the following exemplary embodiments do not represent all implementations that are consistent with this application. On the contrary, the implementations are merely examples of apparatuses and methods that are described in detail in the appended claims and that are consistent with some aspects of this application.

Qubit: A unit of measurement of quantum information in quantum informatics. Unlike a conventional bit which can only be in either of 0 or 1 states, the qubit can be in the 0 and 1 states at the same time, that is, a quantum superposition state of 0 and 1.

Josephson junction: Or referred to as a superconducting tunnel junction. Generally, Josephson junction is in a structure composed of two superconductors sandwiching an extremely thin barrier layer (thickness≤a coherence length of a Cooper electron pair), such as an S (Superconductor)-I(Semiconductor or Insulator)-S (Superconductor) structure, SIS for short. In Josephson junction, a superconducting electron can pass through a semiconductor or the insulator film from one side to the other side through a tunnel effect.

Superconducting circuit: When an ambient temperature drops to a certain threshold, the electrical resistance of some materials disappears (e.g., completely disappears) and a superconducting phenomenon appears. A circuit structure made of these materials is called the superconducting circuit.

Quantum chip: A chip based on laws of quantum mechanics. In particular, when a selected carrier is a superconducting quantum circuit and a Josephson junction, the chip is called a superconducting quantum chip.

The superconducting quantum chip is one of the important carriers that can be used to study quantum computation, which is generally composed of a substrate, a waveguide film layer (also known as a large circuit structure), a qubit structure, and other structures. The main function of the waveguide film layer is to transmit and control the microwave and electromagnetic field of the qubit. Theoretically, considering the loss of the microwave and electromagnetic field, it is preferable to make the waveguide film layer thicker, so that device performance, such as a Q value, is better. At present, the qubit structure is mainly Josephson junction, and a preparation method of the qubit structure by using double-tilt evaporation restricts the thickness of a junction region and a superconducting layer connecting the junction to an external circuit, so the thickness of the waveguide film layer of the large circuit is also correspondingly limited.

Flip-chip superconducting quantum chip: With an increase of the number of qubits, a simple planar quantum chip design is limited by a size and difficult to scale. Therefore, a flip-chip superconducting quantum chip packaging technology is developed. The process procedure of the flip-chip superconducting quantum chip packaging technology mainly includes: manufacturing contact welding spots respectively on two chips (top chip and bottom chip) configured for a flip chip technology; and connecting the top chip and the bottom chip by pressure welding through the prepared welding spots.

Under bump metallization (UBM) layer of flip-chip superconducting quantum chip: In the process of manufacturing the contact welding spots of the top chip and the bottom chip, the superconducting circuit structure of the top chip and the bottom chip is formed based on etching of an aluminum film, and the indium material used for the contact welding spot is easy to form an alloy with the aluminum material and cannot superconduct, which damages the superconducting circuit structure. In the process of manufacturing indium pillar welding spot, the UBM layer is often introduced as a medium between the indium pillar welding spot and the top (bottom) chip. The UBM layer needs to form a good superconducting contact with both the top (bottom) chip and the indium pillar welding spot.

Magnetron sputtering coating: The magnetron sputtering coating is a common coating method. The basic principle is that an electron collides with a gas molecule (usually a nitrogen molecule or an argon molecule) under a combined action of an electric field and a magnetic field, to generate a nitrogen cation or an argon cation. The cation bombards a surface of a target material, causing a target material atom to be evaporated onto a substrate surface.

Niobium: A superconducting metal material with a superconducting transition temperature of about 9 K.

Ion beam etching: A physical etching method. The basic principle is that an electron collides with an inert gas molecule (usually an argon molecule), to generate a cation. The cation accelerates bombardment to a sample surface under an action of an electric field to achieve a physical etching effect.

A solution shown in an embodiment of this application provide a qubit assembly configured for a flip-chip superconducting quantum chip. For example, the qubit assembly may be a single planar superconducting quantum chip in the flip-chip superconducting quantum chip, or the qubit assembly may be a part of the planar superconducting quantum chip. FIG. 1 is a schematic structural diagram of a qubit assembly according to an exemplary embodiment of this application. As shown in FIG. 1, the qubit assembly may include a substrate 101, a superconducting circuit layer 102, a UBM layer 103, and a welding spot 104 (e.g., a solder spot).

The superconducting circuit layer 102 is located on the substrate 101.

The UBM layer 103 is located on the superconducting circuit layer 102, and a superconducting connection is formed between the UBM layer 103 and the superconducting circuit layer 102. A material of the UBM layer 103 is a metal niobium.

The welding spot 104 is located on the UBM layer 103, and a superconducting connection is formed between the welding spot 104 and the UBM layer 103.

In some implementations, a material of the welding spot 104 is a metal indium.

In this embodiment of this application, by using a metal indium as a material of a welding spot, a good superconducting contact can be formed between the welding spot and the UBM layer, and a superconducting effect can be improved at the welding spot.

In some implementations, a material of the superconducting circuit layer 102 is aluminum.

In this embodiment of this application, a good superconducting contact can be formed between the metal indium and the metal niobium, and a good superconducting contact can also be formed between the metal niobium and the superconducting circuit layer. Meanwhile, the metal niobium, as a UBM layer, can also prevent the metal indium and the aluminum superconducting circuit layer from directly contacting with each other to form an alloy, which can damage a superconducting circuit structure.

In conclusion, according to the solution shown in this embodiment of this application, in the qubit assembly configured for a flip-chip superconducting quantum chip, a UBM layer made of a metal niobium is arranged between a superconducting circuit layer and a welding spot. The metal niobium is a superconducting material, and the metal niobium is easier to peel off, and has less impact on the cleanliness of the superconducting circuit layer. Moreover, an oxide layer on the surface of the niobium is easier to remove than that on the surface of other superconducting materials, thereby forming a better superconducting contact with the welding spot. Therefore, by using the metal niobium as the UBM layer, superconducting performance between two planar superconducting quantum chips in the flip-chip superconducting quantum chip can be greatly improved, thereby improving performance of the flip-chip superconducting quantum chip.

In the foregoing embodiment of this application, using the superconducting metal niobium as the UBM layer can be applied to a flip-chip superconducting quantum chip (such as a 2-bit flip-chip superconducting quantum chip or 49-bit flip-chip superconducting quantum chip), to realize a superconducting circuit connection between multiple aluminum superconducting circuit layers. The niobium film, as the UBM layer, can prevent the formation of an alloy between the aluminum circuit and welding spot indium to affect the superconducting connection. Meanwhile, an excellent etching rate and a convenient preparation method of the niobium film also greatly improve efficiency and performance of multi-layer aluminum superconducting circuit connection.

Figure 2:
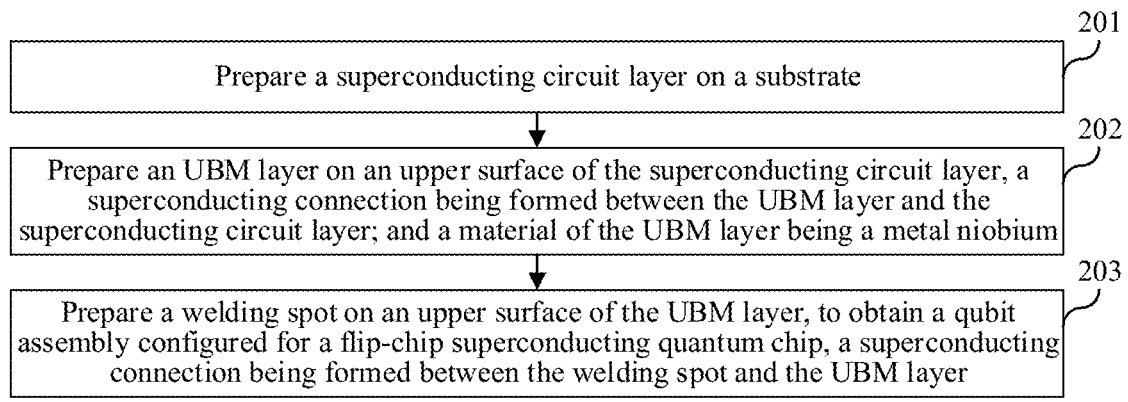
FIG. 2 is a method flowchart of a qubit assembly preparation method according to an exemplary embodiment of this application.

A subsequent embodiment of this application provides a preparation solution for a qubit assembly. FIG. 2 is a method flowchart of a qubit assembly preparation method according to an exemplary embodiment of this application. As shown in FIG. 2, the method may include the following steps:

Step 201: Prepare a superconducting circuit layer on a substrate.

The substrate may be made of sapphire or high-resistivity silicon, and the superconducting circuit layer may be made of a metal aluminum.

The superconducting circuit layer may include a physical qubit (such as a Josephson junction) and an outer circuit connected to the physical qubit.

Step 202: Prepare a UBM layer on an upper surface of the superconducting circuit layer, a superconducting connection being formed between the UBM layer and the superconducting circuit layer; and a material of the UBM layer being a metal niobium.

Step 203: Prepare a welding spot on an upper surface of the UBM layer, to obtain a qubit assembly configured for a flip-chip superconducting quantum chip, a superconducting connection being formed between the welding spot and the UBM layer.

In this embodiment of this application, the welding spot may be in a columnar structure composed of a metal indium.

In this embodiment of this application, the qubit assembly includes the substrate, the superconducting circuit layer, the UBM layer, and the welding spot from bottom to top. Accordingly, when the qubit assembly is prepared, the superconducting circuit layer, the UBM layer, and the welding spot are also prepared layer by layer in the order.

In conclusion, according to the solution shown in this embodiment of this application, the superconducting circuit layer, the UBM layer of a metal niobium material, and the welding spot are prepared layer by layer on the substrate. The metal niobium is a superconducting material, and the metal niobium is easier to peel off than gold, and has less impact on the cleanliness of the superconducting circuit layer. Moreover, an oxide layer on the surface of the niobium is easier to remove than that on the surface of other superconducting materials, thereby forming a better superconducting contact with the welding spot. Therefore, by using the metal niobium as the UBM layer, superconducting performance between two planar superconducting quantum chips in the flip-chip superconducting quantum chip can be greatly improved, thereby improving performance of the flip-chip superconducting quantum chip.

Figure 3:
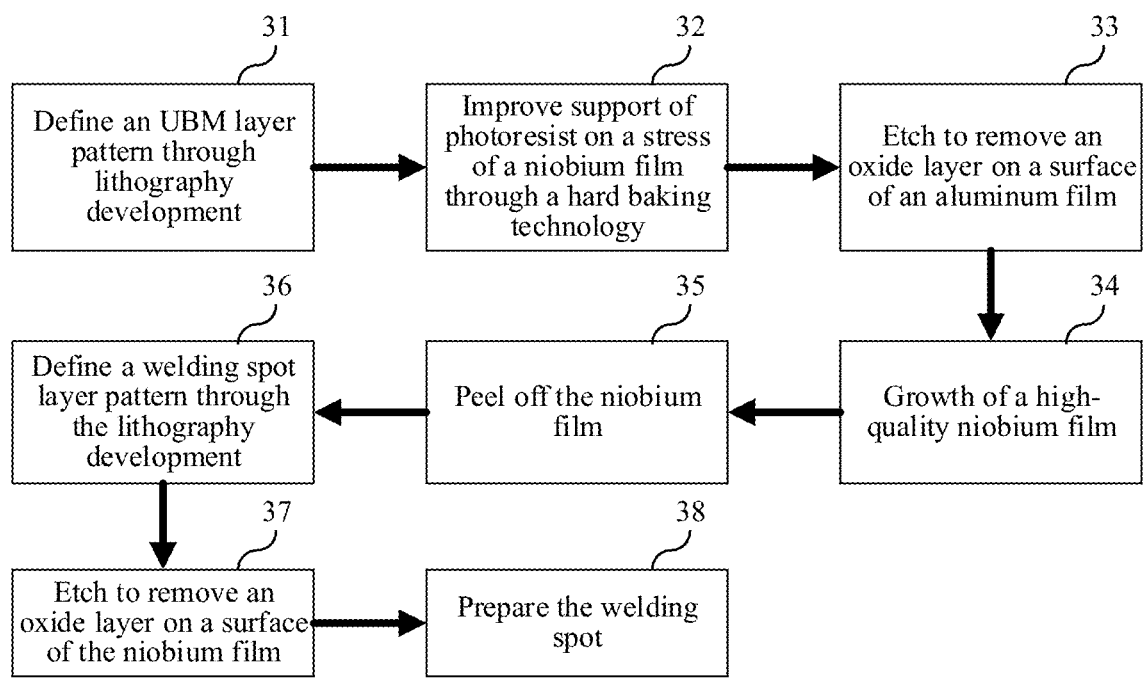
FIG. 3 is a frame diagram of preparation of a qubit assembly according to this application.

FIG. 3 is a frame diagram of preparation of a qubit assembly according to this application. As shown in FIG. 3, in the foregoing embodiment of this application, the main preparation steps of using the superconducting metal niobium as the UBM layer of the flip-chip superconducting quantum chip to prepare the indium welding spot can be divided into the following steps:

(S31) define a UBM layer pattern through lithography development; (S32) improve support of photoresist on a stress of a niobium film through a hard baking technology; (S33) etch to remove an oxide layer on a surface of an aluminum film; (S34) growth of high-quality niobium film; (S35) peel off the niobium film; (S36) define a welding spot layer pattern through the lithography development; (S37) etch to remove an oxide layer on a surface of the niobium film; and (S38) prepare the welding spot.

Figure 4:
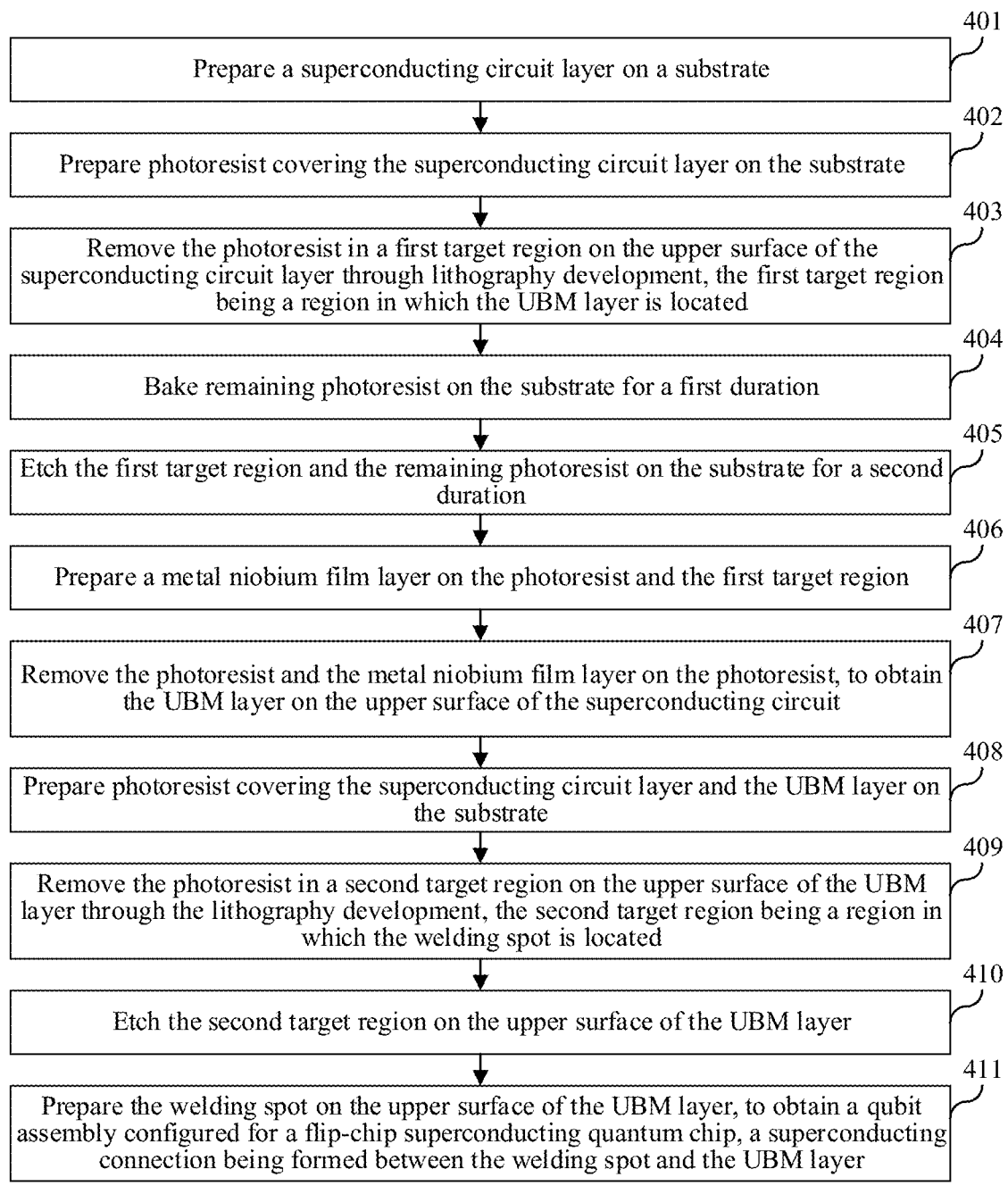
FIG. 4 is a method flowchart of a qubit assembly preparation method according to an exemplary embodiment of this application.

Refer to FIG. 4 in combination with FIG. 3. FIG. 4 is a method flowchart of a qubit assembly preparation method according to an exemplary embodiment of this application. As shown in FIG. 4, the method may include the following steps:

Step 401: Prepare a superconducting circuit layer on a substrate.

In this embodiment of this application, the superconducting circuit layer can be prepared on the substrate through the steps of evaporating a superconducting metal, defining a circuit layer through lithography development, and performing solution etching.

A material of the superconducting circuit layer is a metal aluminum.

For example, first, a layer of superconducting material (such as metal aluminum) is evaporated on the substrate (for example, a material of the substrate may be sapphire or high-resistivity silicon). Then, a first photoresist is spin-coated on an upper layer of the superconducting material, and a pattern of the superconducting circuit layer is defined on the surface of the superconducting material through lithography development. In this case, the substrate contains a layer of superconducting material and the first photoresist on the upper layer of the superconducting material that is not removed by the lithography development. Then, the defined circuit pattern is etched with an acidic solution. Finally, the residual first photoresist spin-coating is removed through a degumming solution and deionized water, and the superconducting circuit layer is retained on the substrate.

The first photoresist is a positive photoresist.

The lithography manner may be ultraviolet exposure or laser direct writing.

The developer may be tetramethylammonium hydroxide (TMAH), TMAH diluent, or the like.

For example, in this embodiment of this application, AZ6112 photoresist can be spin-coated on a sample (that is, a substrate sample with the superconducting material evaporated) and baked at a certain temperature (such as 100° C.) for a period of time. Then, the sample is put into a laser direct writing device (that is, the mask aligner), and the pattern (that is, the pattern corresponding to the superconducting circuit layer) is engraved with a specific parameter. Next, the sample is placed in a 2.38% TMAH solution for development for a period of time, and then put into the deionized water for fixing.

The development is a key step to generate the pattern in the photoresist on the substrate surface. After exposure, a soluble region of the photoresist can be dissolved by a chemical developer, and a visible island or window pattern can be left on the substrate surface. For the positive photoresist, during the development process, the photoresist in a non-exposed region does not have acid-base neutralization during development as no chemical reaction occurs during exposure. Therefore, the photoresist in the non-exposed region is retained and the exposed positive photoresist is gradually dissolved. For a negative photoresist, the negative photoresist in the non-exposed region first forms a gel in the developer and then decomposes. The photoresist pattern left after the development is used as a mask in subsequent etching and ion implantation.

Step 402: Prepare photoresist covering the superconducting circuit layer on the substrate.

In this embodiment of this application, after the superconducting circuit layer is prepared on the substrate, a layer of second photoresist can be spin-coated on the substrate, and the second photoresist covers the superconducting circuit layer.

The second photoresist and the first photoresist may be of the same material or of different materials.

Step 403: Remove the photoresist in a first target region on the upper surface of the superconducting circuit layer through lithography development, the first target region corresponding to a region in which the UBM layer is located.

In this step, after spin-coating the second photoresist covering the superconducting circuit layer, the second photoresist in the region where the UBM layer needs to be prepared (that is, the first target region) on the upper surface of the superconducting circuit layer can be removed through the lithography development, and the second photoresist in the remaining region is retained.

Step 404: Bake remaining photoresist on the substrate for a first duration after removing the photoresist in the first target region.

In some implementations, the first duration has a time duration interval of 1 minute to 2 minutes.

Step 405: Etch the first target region and the remaining photoresist on the substrate for a second duration, the etching being ion beam etching or chemical etching.

Figure 5:
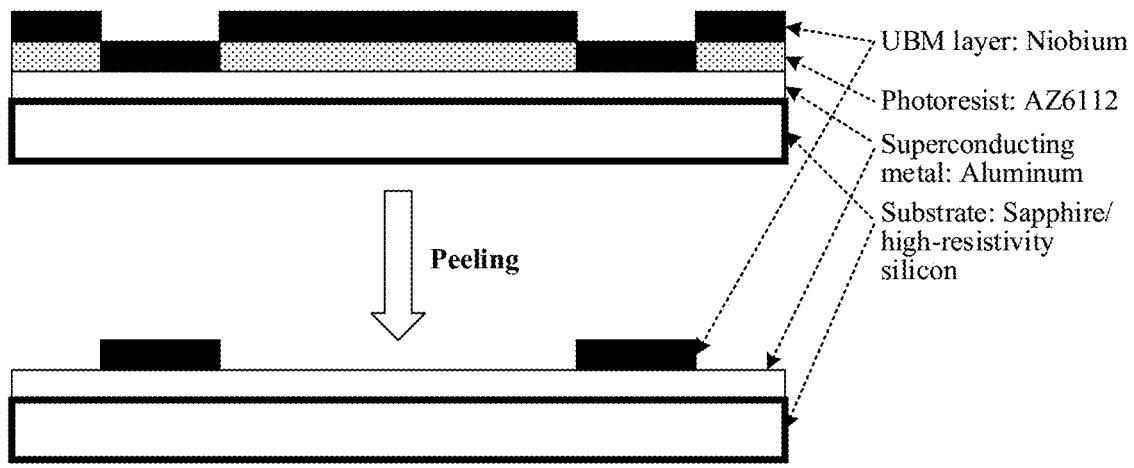
FIG. 5 is a schematic diagram of preparation of a metal niobium film layer according to the embodiment shown in FIG. 4.

FIG. 5 is a schematic diagram of preparation of a metal niobium film layer according to an embodiment of this application. As shown in FIG. 5, in this embodiment of this application, the niobium film, as the UBM layer, is obtained by a peeling technology. The basic principle is that a growth region of the UBM layer is exposed through the lithography technology, and then the photoresist is cleaned (e.g., washed off) using the degumming solution (such as Remover PG) after the coating is completed, so that only the growing UBM layer niobium film is retained.

Figure 6:
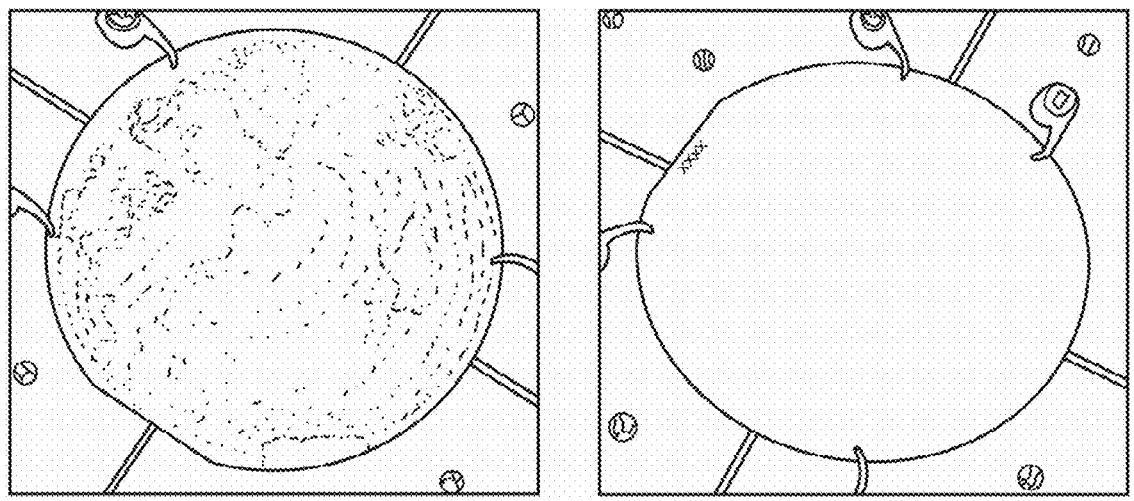
FIG. 6 is a comparison diagram of a niobium film according to the embodiment shown in FIG. 4.

In an actual coating process, there can be a lot of stress on the surface of the niobium film. Accordingly, if the sample surface is not well processed, the stress of the niobium film can lead to cracking of the film layer, which can result in incomplete peeling of the photoresist and the niobium film layer on the photoresist surface in the subsequent peeling process for the photoresist. This will in turn affect the cleanliness of the superconducting circuit and reduce performance of the superconducting quantum chip. FIG. 6 show a comparison between a cracked niobium film under stress and a high-quality niobium film after a technology optimization according to this embodiment of this application. In FIG. 6, the niobium film on the left side is cracked. In the subsequent peeling process, the photoresist and the niobium film layer on the photoresist surface cannot be completely peeled off. The niobium film on the right side is not cracked. In the subsequent peeling process, the photoresist and the niobium film layer on the photoresist surface can be peeled off more cleanly to obtain a high-quality UBM layer.

For the foregoing problems, in the solution shown in this embodiment of this application, the second photoresist after the lithography development can be processed before preparing the metal niobium film layer, so as to improve the supporting effect of the second photoresist on the stress of the niobium film. The foregoing processing manner includes a hard baking technology (that is, baking on a hot plate after the development is completed) and an etching technology.

Under normal circumstances, the photoresist can be baked before the lithography, and the photoresist is not baked after the lithography development is completed. In the solution shown in this embodiment of this application, the operation of baking the photoresist for one or more times after the lithography development is completed can be added to improve the supporting effect of the photoresist on the stress of the niobium film.

In addition, according to the solution shown in this embodiment of this application, the photoresist can be etched (such as the ion beam etching) once after the lithography development is completed, so as to form an etching trace on the photoresist surface, and increase a contact area between the photoresist and the niobium film layer, thereby improving the supporting effect of the photoresist on the stress of the niobium film.

Referring to Table 1 below, the AZ6112 photoresist is used as the photoresist as an example. Table 1 shows a time table of film cracking under the stress of the niobium film according to an embodiment of this application.

TABLE 1

| Number of experimental groups | Gas flow (sccm) | Air pressure (torr) | Whether to perform lithography | Ion beam etching | Hard baking | Coating power (W) | Persistence time |
|---|---|---|---|---|---|---|---|
| 1 | 5 | $10^{-2}$ | Yes/No | No | No | 100 | No cracking in 25 min |
| 2 | 5 | $5 \times 10^{-3}$ | Yes | No | No | 100 | 9 min |
| 3 | 5 | $5 \times 10^{-3}$ | Yes | No | No | 150 | 210 s |
| 4 | 5 | $5 \times 10^{-3}$ | Yes | 150 s | No | 150 | 8 min |
| 5 | 5 | $10^{-3}$ | No | 150 s | 120 s | 100 | No cracking in 15 min |
| 6 | 5 | $10^{-3}$ | No | 150 s | 60 s | 100 | No cracking in 15 min |

By comparing experimental group 3 and experimental group 4, it can be seen that the ion beam etching technology can increase the supporting effect of the photoresist (AZ6112) on the stress of the niobium film. By comparing experimental group 4 and experimental group 5, it can be seen that the hard baking technology can further improve the supporting effect of the photoresist AZ6112 on the stress of the niobium film on the basis of the ion beam etching technology. By comparing experimental group 5 and experimental group 6, it can be seen that a hard baking time of about 1 minute can improve the support of the photoresist AZ6112 on the stress of the niobium film, so as to meet a growth demand of the UBM layer.

Based on experimental data shown in Table 1, in the solution shown in this embodiment of this application, the first duration for baking the photoresist remaining on the substrate can be set to about 1 minute. For example, the first duration may be set to 1 minute or 2 minutes, or the first duration may be set to any duration between 1 minute and 2 minutes, so as to ensure the supporting effect of the photoresist on the stress of the niobium film.

In the experimental data in Table 1, the etching manner is the ion beam etching. In some embodiments, the etching manner comprises chemical etching.

In this embodiment of this application, the foregoing step of etching the first target region on the upper surface of the superconducting circuit layer can not only improve the supporting effect of the remaining photoresist on the stress of the niobium film, but also remove an oxide layer of the first target region on the upper surface of the superconducting circuit layer.

As a superconducting metal material, aluminum has a critical transition temperature of 1.196 K, which is easy to form a Josephson junction in an aluminum-alumina-aluminum structure. Therefore, the aluminum is widely used in the preparation of the superconducting circuit.

When the aluminum material is exposed to the air, a dense oxide layer is formed on the surface. The oxide layer has an insulating effect, which affects the superconducting performance. Therefore, in this embodiment of this application, before preparing the UBM layer on the upper layer of the superconducting circuit layer, the ion beam etching or chemical etching may be performed on the first target region on the upper surface of the superconducting circuit layer to remove the oxide layer of the first target region on the upper surface of the superconducting circuit layer.

In some implementations, the second duration of the etching ranges from 120 seconds to 180 seconds.

In this embodiment of this application, a group of film strip resistors are prepared by the aluminum film, and the thickness of the oxide layer and the etching time required to etch the oxide layer are calculated by measuring experimental results of the film strip resistors after different etching times for the film strip resistors. The principle of this method is: resistance value after etching/resistance value before etching=thickness of aluminum film before etching/thickness of aluminum film after etching total thickness of aluminum and alumina before etching/total thickness of aluminum and alumina after etching.

Figure 7:
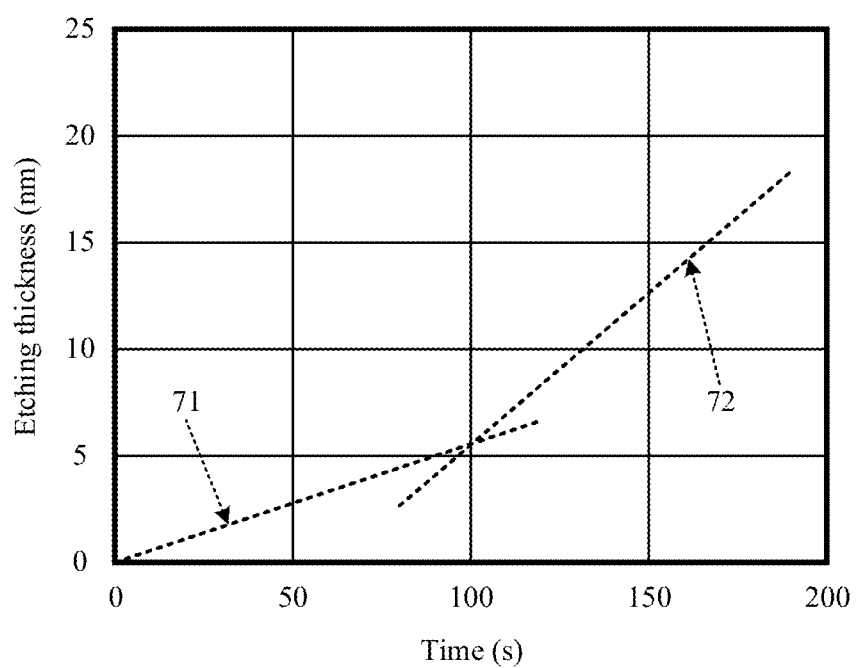
FIG. 7 is a schematic diagram of an etching curve according to the embodiment shown in FIG. 4.

FIG. 7 is a schematic diagram of an etching curve according to this embodiment of this application. As shown in FIG. 7, an ion source under the same etching condition has different etching rates for the alumina and aluminum. Refer to the etching curves with different slopes in FIG. 7. An etching curve 71 is a curve of an etching thickness and an etching time when the ion source etches the alumina under a certain etching condition, and a correspondence of the curve is y=0.0617x, where y is the etching thickness, and x is the etching time. An etching curve 72 is a curve of an etching thickness and an etching time when the ion source etches the aluminum under a certain etching condition, and a correspondence of the curve is y=0.1583x−9.765. A time point (101.087 s) at which the etching curve 71 and the etching curve 72 intersect may be regarded as a time when the oxide layer is just etched. Based on the foregoing experimental results, a duration (that is, the second duration) of about 150 s is used as the etching time to ensure a superconducting contact between the aluminum and niobium. For example, in the solution shown in this embodiment of this application, the second duration for the ion beam etching or chemical etching on the first target region and the remaining photoresist on the substrate can be set between 2 minutes and 3 minutes, so as to ensure a removal effect of the oxide layer on the aluminum superconducting circuit layer and avoid excessive loss on the aluminum superconducting circuit under the oxide layer. For example, the second duration may be 120 s, 150 s, 180 s, or the like, or may alternatively be set to any other duration between 2 minutes and 3 minutes.

After the oxide layer of the first target region on the upper surface of the superconducting circuit layer is removed, the UBM layer can be prepared in the first target region on the upper surface of the superconducting circuit layer. This process refers to the following steps.

Step 406: Prepare a metal niobium film layer on the photoresist and the first target region.

In some implementations, the preparing a metal niobium film layer on the photoresist and the first target region includes:

preparing the metal niobium film layer on the photoresist and the first target region through magnetron sputtering.

In some implementations, an air pressure for the magnetron sputtering ranges from $8 \times 10^{-4}$ torr to $2 \times 10^{-3}$ torr.

In some implementations, a distance between a niobium target material of the magnetron sputtering and the substrate ranges from 8 cm to 12 cm.

In some implementations, power of the magnetron sputtering ranges from 150 W to 220 W.

In some implementations, gas flow of the magnetron sputtering ranges from 4 sccm to 6 sccm.

In this embodiment of this application, a growth manner of the niobium film may be the magnetron sputtering, so as to provide an achievable niobium film preparation solution. A basic principle of the solution is that an electron collides with an argon molecule under a combined action of an electric field and a magnetic field, to generate an argon cation. The cation bombards a surface of a niobium target material, causing a target material atom to be evaporated onto the substrate surface. In the process of magnetron sputtering coating, the gas flow, working gas pressure, distance between the target and the substrate, and coating power are adjustable parameters.

In this embodiment of this application, the gas flow, working gas pressure, distance between the target and the substrate, and coating power can be selected based on the following experimental results.

1) The working gas pressure is determined through a first group of experiments, and the experiment is designed as follows: keeping the gas flow of 5 standard cubic centimeter per minute (sccm) unchanged, keeping the distance between the target and the substrate of 10 cm and the coating power of 150 W unchanged, and dividing the working gas pressure into $10^{-3}$ torr, $5 \times 10^{-3}$ torr, and $10^{-2}$ torr. After the coating is completed, the morphology is observed under a scanning electron microscope. FIG. 8 is an electron microscope image of a surface of a niobium film under different air pressures according to this embodiment of this application.

In FIG. 8, from left to right, the electron microscope images of the surface of the niobium film at the working gas pressure of $10^{-3}$ torr, $5 \times 10^{-4}$ torr, $10^{-2}$ torr are respectively shown. It can be seen from the figure that when the working gas pressure is $10^{-3}$ torr, the surface of the niobium film is in the shape of ordered elongated crystal particles. When the working gas pressure is $5 \times 10^{-3}$ torr, the surface of the niobium film is in a state where the elongated crystal particles and irregular crystal particles coexist. When the working gas pressure is $10^{-2}$ torr, the surface of the niobium film completely becomes an irregular crystal particle state. Therefore, in this embodiment of this application, the air pressure of about $10^{-3}$ torr can be selected as the working gas pressure of the optimized niobium film coating to ensure the coating quality of the surface of the niobium film. For example, the air pressure of $10^{-2}$ torr may be selected as the working gas pressure, or $8 \times 10^4$ torr or $2 \times 10^{-3}$ torr may be selected as the working gas pressure, or any other gas pressure between $8 \times 10^4$ torr and $2 \times 10^{-3}$ torr may be selected as the working gas pressure.

Figure 9:
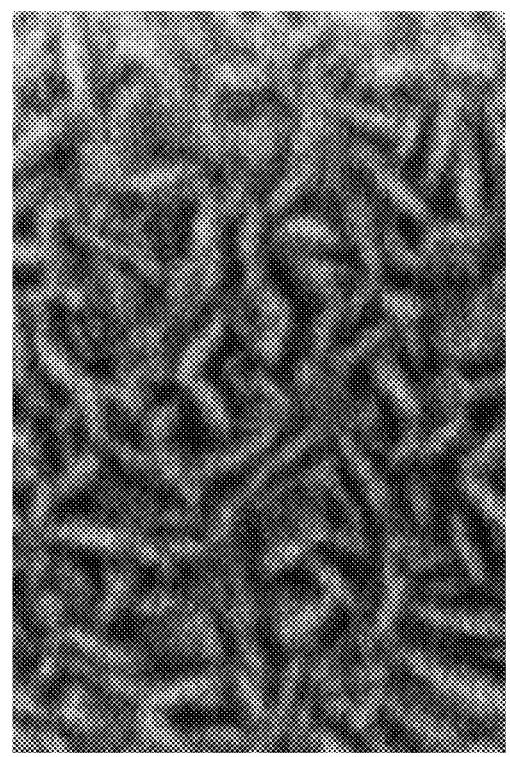
FIG. 9 is an electron microscope image of a surface of a niobium film under different distances according to the embodiment shown in FIG. 4.
Figure 9:
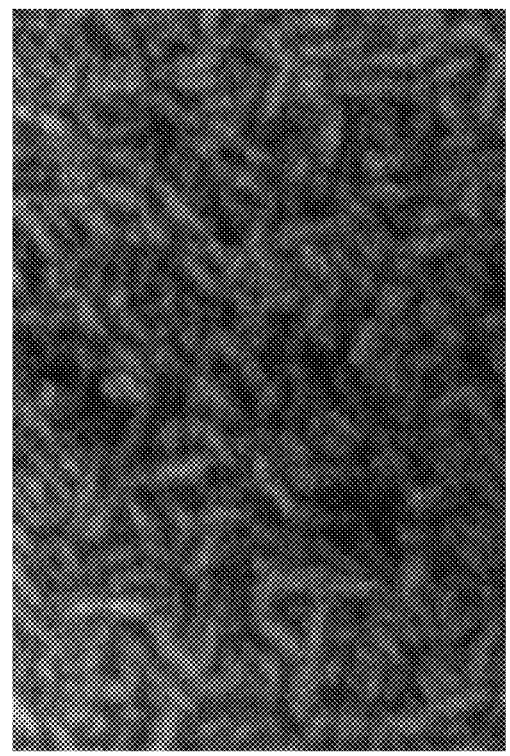

2) The working distance between the target and the substrate is determined through a second group of experiments, and the experiment is designed as follows: keeping the gas flow of 5 sccm, the coating power of 150 W, and the working gas pressure of $10^{-3}$ torr unchanged, and adjusting the working distance between the target and the substrate to 8 cm and 10 cm. After the coating is completed, the morphology is observed under the scanning electron microscope. FIG. 9 is an electron microscope image of a surface of a niobium film under different distances according to this embodiment of this application.

In FIG. 9, from left to right, the electron microscope images of the surface of the niobium film at the working distances of 10 cm and 8 cm are respectively shown. It can be seen from FIG. 9 that when the working distance is 10 cm, the size of the crystal particle on the surface of the niobium film is smaller and more even, while when the working distance is 8 cm, the size of the crystal particle on the surface of the niobium film becomes larger. Therefore, in this embodiment of this application, the distance between the target and the substrate of about 10 cm may be selected as the optimized working distance. For example, the distance of 10 cm may be selected as the working distance, or the distance of 8 cm or 12 cm may be selected as the working distance, or any other distance between 8 cm and 12 cm may be selected as the working distance, thereby ensuring the evenness of the crystal particle on the surface of the niobium film.

Figure 10:
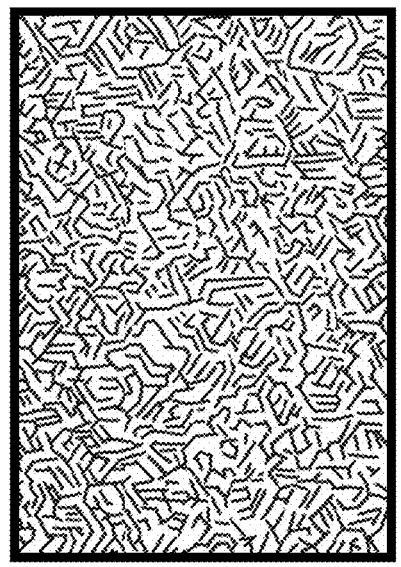
FIG. 10 is an electron microscope image of a surface of a niobium film under different coating power according to the embodiment shown in FIG. 4.
Figure 10:
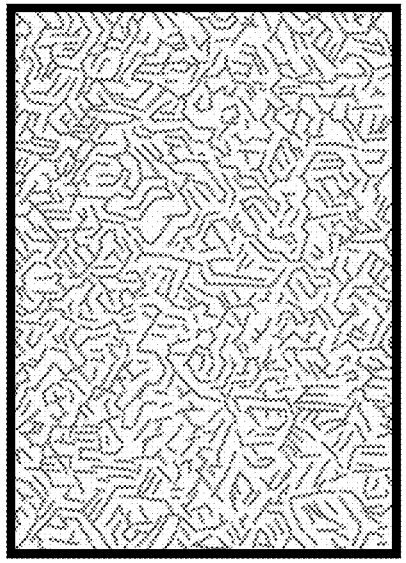
Figure 10:
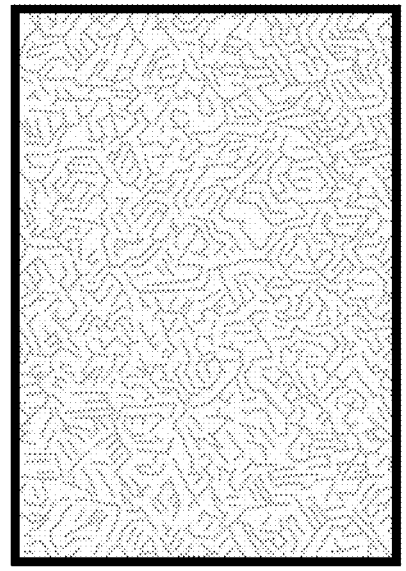

3) The coating power is determined through a third group of experiments, and the experiment is designed as follows: keeping the gas flow of 5 sccm, the working gas pressure of $10^{-3}$ torr, and the working distance between the target and the substrate of 10 cm unchanged, and setting the coating power being 100 W, 150 W, and 200 W respectively. After the coating is completed, the morphology is observed under the scanning electron microscope. FIG. 10 is an electron microscope image of a surface of a niobium film under different coating power according to this embodiment of this application.

In FIG. 10, from left to right, the electron microscope images of the surface of the niobium film at the coating power of 100 W, 150 W, and 200 W are respectively shown.

Figure 11:
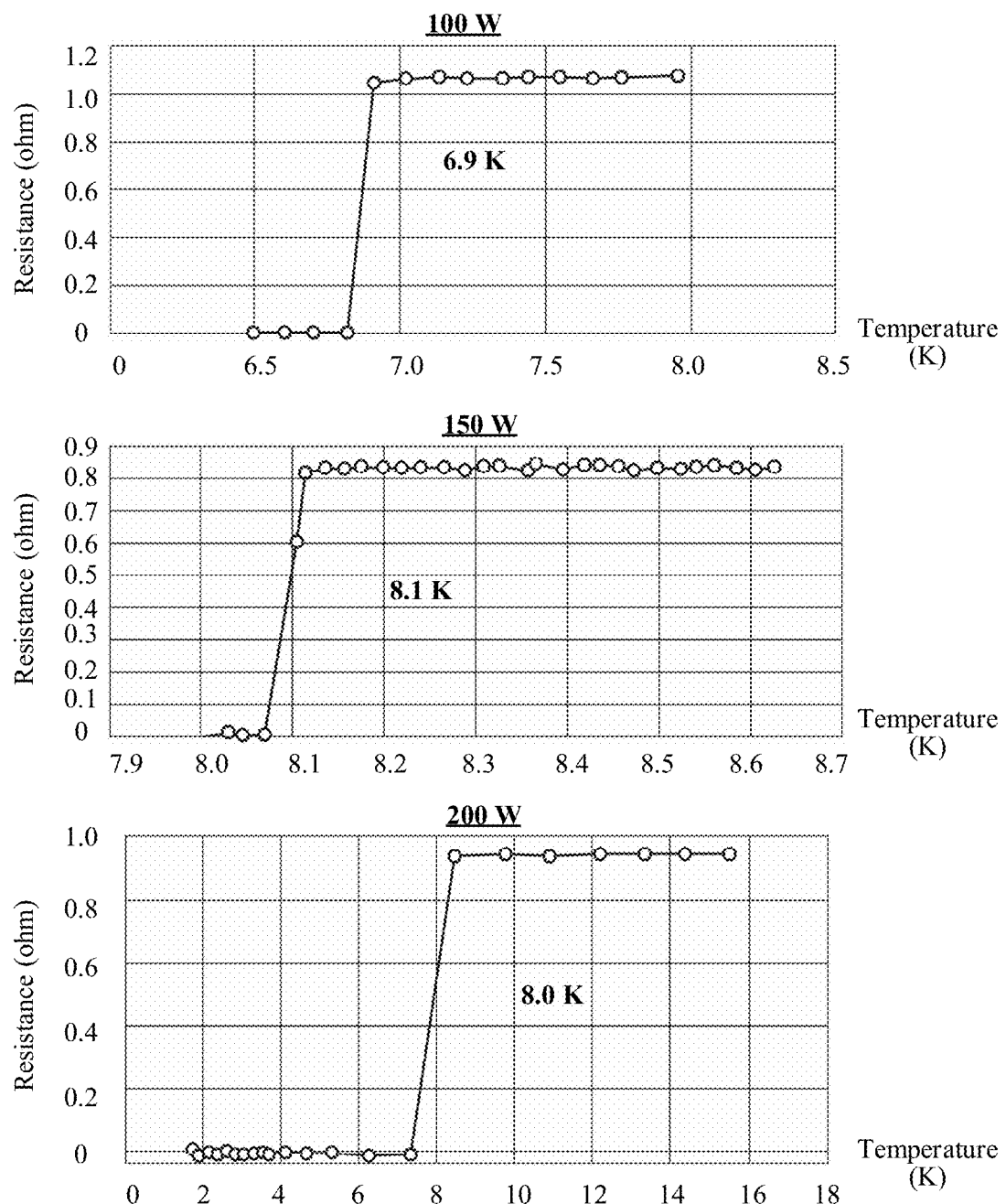
FIG. 11 is a schematic diagram of a superconducting transition temperature of a niobium film sample under different coating power according to the embodiment shown in FIG. 4.

It can be seen from FIG. 10 that under the scanning electron microscope, there is no significant difference on the surface of the niobium film under several different coating power. In order to further confirm the optimized coating power, superconducting transition temperatures of the niobium film sample under the foregoing three different coating power values are tested respectively. FIG. 11 is a schematic diagram of a superconducting transition temperature of a niobium film sample under different coating power.

It can be seen from FIG. 11 that the superconducting transition temperature of the niobium film is 6.9 K at the coating power of 100 W, while the superconducting transition temperature of the niobium film is about 8 K at the coating power of 150 W and 200 W. Therefore, the coating power may be determined by combining 150 W and 200 W. For example, in consideration of coating efficiency, power of about 200 W may be selected as the coating power. For example, the coating power may be directly set to 200 W, or power of 150 W or 220 W may be selected as the coating power, or any other power between 150 W and 220 W may be selected as the coating power, thereby ensuring the coating efficiency.

Step 407: Remove the photoresist and the metal niobium film layer on an upper layer of the photoresist, to obtain the UBM layer on the upper surface of the superconducting circuit layer.

In this embodiment of this application, after the second photoresist and the metal niobium film on the upper layer of the second photoresist are removed, the UBM layer of the metal niobium material can be left on the upper layer of the superconducting circuit layer.

The process of removing the second photoresist and the metal niobium film on the upper layer of the second photoresist may be to clean the sample on which the metal niobium film is evaporated through the degumming solution and the deionized water.

After the UBM layer is prepared on the upper layer of the superconducting circuit layer, the UBM layer can be etched to remove an oxide layer on the upper surface of the UBM layer. The etching is the ion beam etching or the chemical etching. This process refers to subsequent step 408 to step 410.

In this embodiment of this application, the preparation of the UBM layer is implemented by lithography development, preparation of the metal niobium film layer, and cleaning and removal of the photoresist.

Step 408: Prepare photoresist covering the superconducting circuit layer and the UBM layer on the substrate.

In this embodiment of this application, after the superconducting circuit layer and the UBM layer are prepared on the substrate, a layer of a third photoresist can be spin-coated on the substrate, and the third photoresist covers the UBM layer.

The third photoresist and the first/second photoresist may be photoresist of the same material or photoresist of different materials.

Step 409: Remove the photoresist in a second target region on the upper surface of the UBM layer through the lithography development, the second target region being a region in which the welding spot is located.

In this step, after the third photoresist covering the UBM layer is spin-coated, the third photoresist in the region where the welding spot needs to be prepared (that is, the second target region) on the upper surface of the UBM layer can be removed through the lithography development, and the third photoresist in the remaining region is retained.

Step 410: Etch the second target region on the upper surface of the UBM layer to remove an oxide layer of the second target region on the upper surface of the UBM layer, the etching being the ion beam etching or the chemical etching.

In this embodiment of this application, a solution that the oxide layer of the second target region on the upper surface of the UBM layer is removed through etching is provided, so as to ensure that the subsequently prepared welding spot can have a good superconducting contact with the UBM layer.

In some implementations, a depth of the ion beam etching or the chemical etching ranges from 15 nm to 18 nm.

Figure 12:
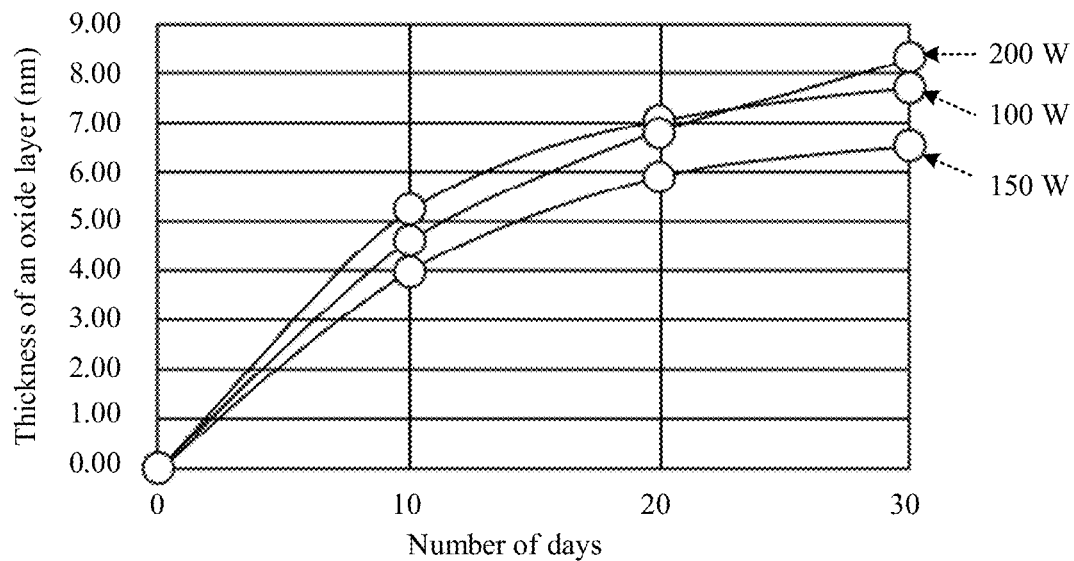
FIG. 12 is a characteristic curve diagram of natural oxidation of a niobium film according to the embodiment shown in FIG. 4.

In a flip-chip superconducting quantum chip, the niobium film, as the UBM layer, undergoes many process steps before the process of removing the oxide layer, and then a superconducting contact with an indium welding spot can be completed. In order to completely remove the oxide layer at the welding spot position on the upper surface of the niobium film and make the niobium film form the good superconducting contact with the indium welding spot, studying oxidation characteristics of the niobium film is also an important part of the solution of using the niobium film as the UBM layer of the flip-chip superconducting quantum chip. In this embodiment of this application, the resistance of the niobium film under the coating power of 100 W, 150 W, and 200 W is respectively studied, and a characteristic curve of natural oxidation of the niobium film in air is tested. FIG. 12 is a characteristic curve diagram of natural oxidation of a niobium film according to this embodiment of this application.

As shown in FIG. 12, a relationship curve of thickness of the oxide layer and the number of days is included. It can be seen from FIG. 12 that the oxidation curve of the niobium film becomes more and more flat with the passage of time. Under three different power conditions, the thickness of the oxide layer on the surface of the niobium film is about 10 nm after 30 days. In order to ensure that the thickness of the oxide layer of the niobium film is completely removed, in the solution of this embodiment of this application, the etching depth in the technology of the ion beam etching or the chemical etching for the UBM layer can be set to more than 15 nm. That is, in the technology of the ion beam etching or the chemical etching, the film layer of more than 15 nm can be removed, so as to ensure the removal effect of the oxide layer on the surface of the UBM layer and the superconducting contact effect between the welding spot and the UBM layer.

For example, in this embodiment of this application, the depth of the ion beam etching or the chemical etching for the UBM layer may be set to 15 nm, 18 nm, or any depth between 15 nm and 18 nm.

Step 411: Prepare the welding spot on the upper surface of the UBM layer, to obtain a qubit assembly configured for a flip-chip superconducting quantum chip, a superconducting connection being formed between the welding spot and the UBM layer.

In this embodiment of this application, after the oxide layer of the second target region on the upper surface of the UBM layer is removed, the welding spot of the indium material can be prepared on the second target region on the upper surface of the UBM layer.

In some implementations, the welding spot can be prepared through evaporation after lithography development. In this case, the preparation process of the welding spot may be similar to the preparation process of the UBM layer, and details are not described herein again.

In conclusion, according to the solution shown in this embodiment of this application, the superconducting circuit layer, the UBM layer of the metal niobium material, and the welding spot are prepared layer by layer on the substrate. The metal niobium is a superconducting material, and the metal niobium is easier to peel off, and has less impact on the cleanliness of the superconducting circuit layer. Moreover, an oxide layer on the surface of the niobium is easier to remove than that on the surface of other superconducting materials, thereby forming a better superconducting contact with the welding spot. Therefore, by using the metal niobium as the UBM layer, superconducting performance between two planar superconducting quantum chips in the flip-chip superconducting quantum chip can be greatly improved, thereby improving performance of the flip-chip superconducting quantum chip.

In an exemplary embodiment of this application, a flip-chip superconducting quantum chip is further provided. The flip-chip superconducting quantum chip includes the qubit assembly as shown in FIG. 1. The qubit assembly can be prepared through the method procedure shown in FIG. 2 or FIG. 4.

In an exemplary embodiment of this application, a computer device is further provided. The computer device includes a flip-chip superconducting quantum chip. The flip-chip superconducting quantum chip includes the qubit assembly as shown in FIG. 1. The qubit assembly can be prepared through the method procedure shown in FIG. 2 or FIG. 4.

Figure 13:
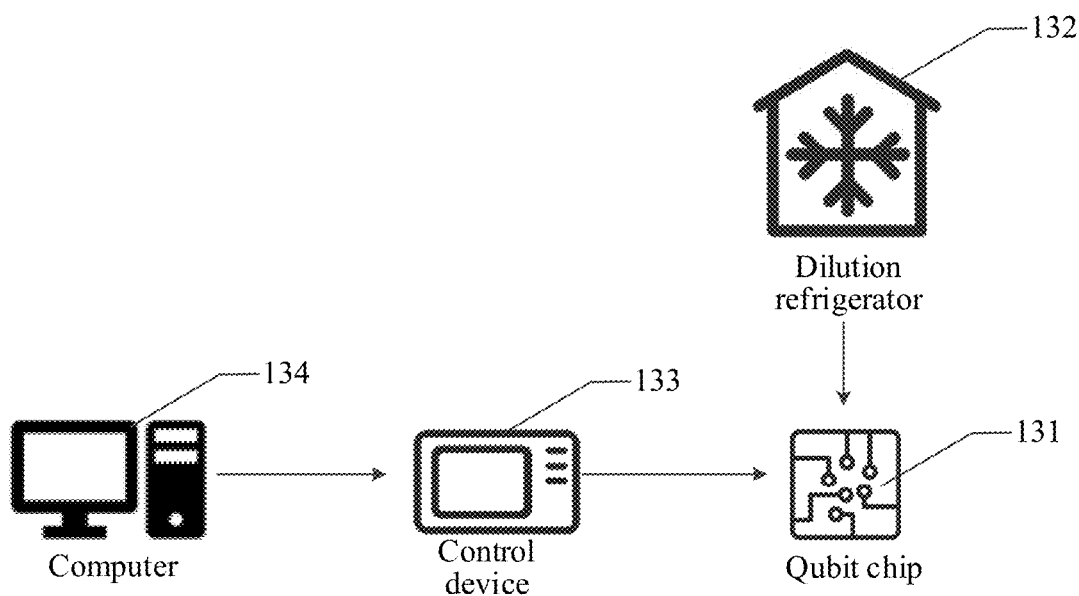
FIG. 13 is a schematic diagram of an application scenario of a solution according to an embodiment of this application.

FIG. 13 is a schematic diagram of an application scenario of a solution according to an embodiment of this application. As shown in FIG. 13, the application scenario may be a superconducting quantum computing platform. The application scenario includes: a qubit chip 131, a dilution refrigerator 132, a control device 133, and a computer 134.

The qubit chip 131 is a circuit acting on a physical qubit, and the qubit chip 131 may be implemented as a quantum computing device. The dilution refrigerator 132 is configured to provide an environment at absolute zero for the superconducting quantum chip. The qubit chip 131 may be the foregoing flip-chip superconducting quantum chip.

The control device 133 is configured to control the qubit chip 131, and the computer 134 is configured to control the control device 133. For example, a programmed quantum program is compiled into an instruction by using software in the computer 134 and transmitted to the control device 133 (such as, an electronic/microwave control system), and the control device 133 transforms the instruction into an electronic/microwave control signal and inputs the electronic/microwave control signal into the dilution refrigerator 132, to control superconducting qubits at a temperature of less than 10 mK. A reading process is opposite to the above, and a read waveform is transmitted to the qubit chip 131.

Figure 14:
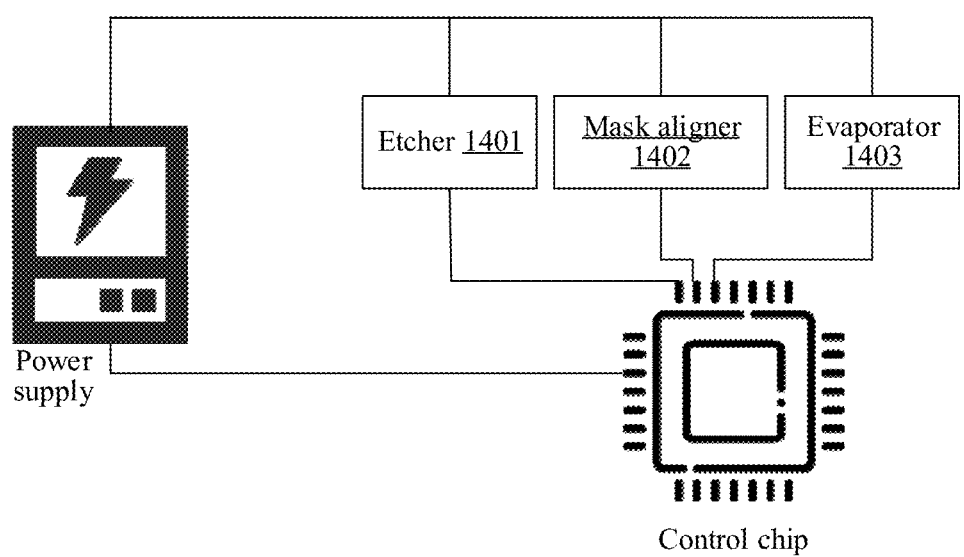
FIG. 14 is a schematic diagram of a production line device according to an exemplary embodiment of this application.

FIG. 14 is a schematic diagram of a production line device according to an exemplary embodiment of this application. As shown in FIG. 14, the production line device includes: an etcher 1401, a mask aligner 1402, and an evaporator 1403. The etcher 1401, the mask aligner 1402, and the evaporator 1403 are configured to cooperatively prepare the qubit assembly shown in FIG. 1.

In some embodiments, the etcher 1401, the mask aligner 1402, and the evaporator 1403 may be configured to cooperatively perform the following steps:

preparing a superconducting circuit layer on a substrate;

preparing a UBM layer on an upper surface of the superconducting circuit layer, a superconducting connection being formed between the UBM layer and the superconducting circuit layer; and a material of the UBM layer being a metal niobium; and preparing a welding spot on the upper surface of the UBM layer, to obtain a qubit assembly configured for a flip-chip superconducting quantum chip, a superconducting connection being formed between the welding spot and the UBM layer.

For example, in this embodiment of this application, the evaporator 1403 is configured to prepare a superconducting circuit layer on a substrate.

The mask aligner 1402, the evaporator 1403, and the etcher 1401 are configured to prepare a UBM layer on an upper surface of the superconducting circuit layer, a superconducting connection being formed between the UBM layer and the superconducting circuit layer; and a material of the UBM layer being a metal niobium.

The mask aligner 1402, the evaporator 1403, and the etcher 1401 are configured to prepare a welding spot on the upper surface of the UBM layer, to obtain a qubit assembly configured for a flip-chip superconducting quantum chip, a superconducting connection being formed between the welding spot and the UBM layer.

In some implementations, preparing a UBM layer on an upper surface of the superconducting circuit layer to prepare an indium welding spot includes:

preparing photoresist covering the superconducting circuit layer on the substrate;

removing the photoresist in a first target region on the upper surface of the superconducting circuit layer through lithography development, the first target region being a region in which the UBM layer is located;

preparing a metal niobium film layer on the photoresist and the first target region; and removing the photoresist and the metal niobium film layer on an upper layer of the photoresist, to obtain the UBM layer on the upper surface of the superconducting circuit layer.

For example, in this embodiment of this application, the mask aligner 1402 is configured to prepare photoresist covering the superconducting circuit layer on the substrate; and remove the photoresist in a first target region on the upper surface of the superconducting circuit layer through lithography development, the first target region being a region in which the UBM layer is located.

The evaporator 1403 and the etcher 1401 are configured to prepare a metal niobium film layer on the photoresist and the first target region; and remove the photoresist and the metal niobium film layer on an upper layer of the photoresist, to obtain the UBM layer on the upper surface of the superconducting circuit layer.

In some implementations, before the preparing a metal niobium film layer on the photoresist and the first target region, the method further includes:

baking remaining photoresist on the substrate for a first duration after removing the photoresist in the first target region.

The evaporator 1403 may be configured to bake remaining photoresist on the substrate for a first duration after removing the photoresist in the first target region and before preparing the metal niobium film layer on the photoresist and the first target region.

In some implementations, a duration interval of the first duration is 1 minute to 2 minutes.

In some implementations, before the preparing a metal niobium film layer on the photoresist and the first target region, the method further includes:

etching the first target region and the remaining photoresist on the substrate for a second duration after removing the photoresist in the first target region, to remove an oxide layer in the first target region and improve a supporting effect of the remaining photoresist on a stress of the niobium film, the etching being ion beam etching or chemical etching.

The etcher 1401 may be configured to perform ion beam etching or chemical etching on the first target region and the remaining photoresist on the substrate for a second duration after removing the photoresist in the first target region and before preparing the metal niobium film layer on the photoresist and the first target region.

In some implementations, the second duration ranges from 2 minutes to 3 minutes.

In some implementations, the preparing a metal niobium film layer on the photoresist and the first target region includes:

preparing the metal niobium film layer on the photoresist and the first target region through magnetron sputtering.

The evaporator 1403 and the etcher 1401 may be configured to prepare the metal niobium film layer on the photoresist and the first target region through magnetron sputtering.

In some implementations, an air pressure for the magnetron sputtering ranges from $8\times10^{-4}$ torr to $2\times10^{-3}$ torr.

In some implementations, a distance between a niobium target material of the magnetron sputtering and the substrate ranges from 8 cm to 12 cm.

In some implementations, power of the magnetron sputtering ranges from 150 W to 220 W.

In some implementations, gas flow of the magnetron sputtering ranges from 4 sccm to 6 sccm.

In some implementations, before the preparing a welding spot on the upper surface of the UBM layer, the method further includes:

etching the UBM layer to remove an oxide layer on the upper surface of the UBM layer.

The etcher 1401 may be further configured to etch the UBM layer to remove an oxide layer on the upper surface of the UBM layer before preparing the welding spot on the upper surface of the UBM layer, the etching being ion beam etching or chemical etching.

The foregoing process of etching the UBM layer may include: preparing photoresist covering the superconducting circuit layer and the UBM layer on the substrate; removing the photoresist in a second target region on the upper surface of the UBM layer through the lithography development, the second target region being a region in which the welding spot is located; and performing the ion beam etching or the chemical etching on the second target region on the upper surface of the UBM layer to remove an oxide layer of the second target region on the upper surface of the UBM layer.

In some implementations, a depth of the etching ranges from 15 nm to 18 nm.

The foregoing process of preparing the qubit assembly by the etcher 1401, the mask aligner 1402 and the evaporator 1403 may refer to descriptions of the embodiment shown in FIG. 2 or FIG. 4, and details are not described herein again.

In some embodiments, the production line device further includes a processor. The processor can be electrically connected with the etcher 1401, the mask aligner 1402 and the evaporator 1403 respectively, and configured to control the etcher 1401, the mask aligner 1402, the evaporator 1403, and the like.

In some embodiments, the production line device further includes a power supply configured to supply power to electrical devices such as the processor, the etcher 1401, the mask aligner 1402, the evaporator 1403, and the like.

In some embodiments, each machine is spatially connected through a conveyor belt, or a preparation object is moved between the machines based on a robot arm.

In some embodiments, the production line device further includes a memory. The memory may be configured to store at least one computer instruction. The processor executes the at least one computer instruction to cause the production line device to perform the foregoing qubit assembly preparation method.

In an exemplary embodiment, a non-transitory computer-readable storage medium is further provided. The computer-readable storage medium stores at least one computer instruction. The at least one computer instruction, when executed by a processor in a production line device, causes the production line device to perform the foregoing qubit assembly preparation method.

In an exemplary embodiment, a computer program product or a computer program is further provided. The computer program product or the computer program includes computer instructions, and the computer instructions are stored in a non-transitory computer-readable storage medium. A processor of a production line device reads the computer instructions from the computer-readable storage medium and executes the computer instructions to cause the production line device to perform the foregoing qubit assembly preparation method.

After considering the specification and practicing the present disclosure, a person skilled in the art may easily conceive of other implementations of this application. This application is intended to cover any variations, uses, or adaptive changes of this application. These variations, uses, or adaptive changes follow the general principles of this application and include common general knowledge or common technical means in the art, which are not disclosed in this application. The specification and the embodiments are considered as merely exemplary, and the actual scope and the spirit of this application are stated in the claims.

It is to be understood that this application is not limited to the precise structures described above and shown in the accompanying drawings, and various modifications and changes may be made without departing from the scope of this application. The scope of this application is limited only by the appended claims. Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter. In some embodiments, the term "preparing" and its equivalents may mean "manufacturing" and its equivalents.

What is claimed is:

1. A qubit assembly preparation method comprising:
    preparing a superconducting circuit layer on a substrate, wherein a material of the superconducting circuit layer is aluminum;
    preparing an under bump metallization (UBM) layer on an upper surface of the superconducting circuit layer, a superconducting connection is formed between the UBM layer and the superconducting circuit layer; and a material of the UBM layer is a metal niobium; and
    preparing a welding spot on an upper surface of the UBM layer to obtain a qubit assembly configured for a flip-chip superconducting quantum chip, wherein a superconducting electrical connection is formed between the welding spot and the UBM layer.

2. The method according to claim 1, wherein the preparing the UBM layer comprises:
    covering the upper surface of the superconducting circuit layer with photoresist; and
    removing the photoresist from a first target region on the upper surface of the superconducting circuit layer through lithography development, the first target region corresponding to a region in which the UBM layer is located.

3. The method according to claim 2, wherein the preparing the UBM layer further comprises:
    preparing a metal niobium film layer on the first target region and on a remaining region that includes the photoresist; and
    removing the photoresist and the metal niobium film layer from the remaining region, to obtain the UBM layer on the upper surface of the superconducting circuit layer.

4. The method according to claim 3, further comprising:
before preparing the metal niobium film layer on the photoresist and the first target region, baking remaining photoresist on the substrate for a first duration after removing the photoresist in the first target region.

5. The method according to claim 4, wherein the first duration has a duration interval of 1 minute to 2 minutes.

6. The method according to claim 3, further comprising:
before preparing the metal niobium film layer on the photoresist and the first target region, etching the first target region and the remaining photoresist on the substrate for a second duration after removing the photoresist in the first target region, the etching being ion beam etching or chemical etching.

7. The method according to claim 6, wherein the second duration ranges from 2 minutes to 3 minutes.

8. The method according to claim 3, wherein preparing the metal niobium film layer on the photoresist and the first target region includes:
preparing the metal niobium film layer on the photoresist and the first target region through magnetron sputtering.

9. The method according to claim 8, wherein an air pressure for the magnetron sputtering ranges from $8 \times 10^{-4}$ torr to $2 \times 10^{-3}$ torr.

10. The method according to claim 8, wherein a distance between a niobium target material of the magnetron sputtering and the substrate ranges from 8 cm to 12 cm.

11. The method according to claim 8, wherein power of the magnetron sputtering ranges from 150 W to 220 W.

12. The method according to claim 8, wherein gas flow of the magnetron sputtering ranges from 4 sccm to 6 sccm.

13. The method according to claim 1, further comprising:
before preparing the welding spot on the upper surface of the UBM layer, etching the UBM layer to remove an oxide layer on the upper surface of the UBM layer, the etching comprising ion beam etching or chemical etching.

14. The method according to claim 13, wherein a depth of the etching ranges from 15 nm to 18 nm.

15. A production line device, comprising:
one or more processors; and
memory storing one or more programs, the one or more programs comprising instructions that, when executed by the one or more processors, cause the production line device to perform operations comprising:
preparing a superconducting circuit layer on a substrate, wherein a material of the superconducting circuit layer is aluminum;
preparing an under bump metallization (UBM) layer on an upper surface of the superconducting circuit layer, a superconducting connection is formed between the UBM layer and the superconducting circuit layer; and a material of the UBM layer is a metal niobium; and
preparing a welding spot on an upper surface of the UBM layer to obtain a qubit assembly configured for a flip-chip superconducting quantum chip, wherein a superconducting electrical connection is formed between the welding spot and the UBM layer.

16. The production line device according to claim 15, wherein preparing the UBM layer comprises:
covering the upper surface of the superconducting circuit layer with photoresist; and
removing the photoresist from a first target region on the upper surface of the superconducting circuit layer through lithography development, the first target region corresponding to a region in which the UBM layer is located.

17. The production line device according to claim 16, wherein preparing the UBM layer further comprises:
preparing a metal niobium film layer on the first target region and on a remaining region that includes the photoresist; and
removing the photoresist and the metal niobium film layer from the remaining region, to obtain the UBM layer on the upper surface of the superconducting circuit layer.

18. The production line device according to claim 17, the operations further comprising:
before preparing the metal niobium film layer on the photoresist and the first target region, baking remaining photoresist on the substrate for a first duration after removing the photoresist in the first target region.

19. The production line device according to claim 17, the operations further comprising:
before preparing the metal niobium film layer on the photoresist and the first target region, etching the first target region and the remaining photoresist on the substrate for a second duration after removing the photoresist in the first target region, the etching being ion beam etching or chemical etching.

20. The production line device according to claim 15, the operations further comprising:
before preparing the welding spot on the upper surface of the UBM layer, etching the UBM layer to remove an oxide layer on the upper surface of the UBM layer, the etching comprising ion beam etching or chemical etching.

* * * * *